United States Patent
Arya et al.

(10) Patent No.: US 7,450,346 B2
(45) Date of Patent: Nov. 11, 2008

(54) METHOD AND APPARATUS FOR REDUCING HEAT ABSORPTION AROUND SOLDER PADS ON AN ELECTRICAL LEAD SUSPENSION

(75) Inventors: Satya Prakash Arya, San Jose, CA (US); Xinzhi Xing, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 378 days.

(21) Appl. No.: 11/037,752

(22) Filed: Jan. 18, 2005

(65) Prior Publication Data
US 2006/0158783 A1 Jul. 20, 2006

(51) Int. Cl.
G11B 21/16 (2006.01)
G11B 5/48 (2006.01)

(52) U.S. Cl. .............. 360/245.1; 360/245.8; 360/245.9

(58) Field of Classification Search .......... 360/245.8, 360/245.9, 246, 245.1; 20/603.06, 840; 174/261; 324/210; 438/612
See application file for complete search history.

(56) References Cited

U.S. PATENT DOCUMENTS

| | | | | |
|---|---|---|---|---|
| 5,098,311 A | * | 3/1992 | Roath et al. | 439/295 |
| 5,422,764 A | | 6/1995 | McIlvanie | |
| 5,815,919 A | * | 10/1998 | Nakanishi et al. | 29/840 |
| 5,909,342 A | | 6/1999 | Forbord et al. | |
| 5,995,329 A | * | 11/1999 | Shiraishi et al. | 360/245.9 |
| 6,414,820 B1 | | 7/2002 | Coon et al. | |
| 6,420,659 B1 | | 7/2002 | Tsutsumi et al. | |
| 6,459,549 B1 | * | 10/2002 | Tsuchiya et al. | 360/245.9 |
| 6,529,350 B1 | | 3/2003 | Itoh | |
| 6,543,673 B2 | | 4/2003 | Lennard et al. | |
| 6,573,711 B1 | * | 6/2003 | Schaenzer et al. | 324/210 |
| 6,700,748 B1 | | 3/2004 | Cowles et al. | |
| 6,891,700 B2 | | 5/2005 | Shiraishi et al. | |
| 7,124,496 B2 | * | 10/2006 | Kashima et al. | 29/603.06 |
| 2002/0105760 A1 | | 8/2002 | Someya | |
| 2002/0181156 A1 | | 12/2002 | Shiraishi et al. | |
| 2002/0181157 A1 | | 12/2002 | Serizawa et al. | |
| 2003/0053257 A1 | | 3/2003 | Wada et al. | |
| 2003/0193753 A1 | | 10/2003 | Arai et al. | |
| 2004/0027631 A1 | | 2/2004 | Nagano et al. | |
| 2004/0134684 A1 | * | 7/2004 | Rissing et al. | 174/261 |
| 2005/0042852 A1 | * | 2/2005 | Chou et al. | 438/612 |
| 2005/0078415 A1 | * | 4/2005 | Tsuchiya et al. | 360/245.8 |

FOREIGN PATENT DOCUMENTS

WO    WO 98/14937    4/1998

* cited by examiner

Primary Examiner—Tianjie Chen

(57) ABSTRACT

An apparatus and method for reducing heat absorption around solder pads on an electrical lead suspension (ELS). The method provides a base-metal layer having at least one opening. A dielectric layer is also provided above the base-metal layer, the dielectric layer covering a portion of the base-metal layer and at least one of the openings in the base-metal layer. A signal conductive layer is provided above dielectric layer. The signal conductive layer carries at least one solder pad portion, wherein the solder pad portion is placed above the portion of the dielectric layer such that the solder pad portion does not align with the at least one opening in the base-metal layer. In so doing, the heat absorption with respect to the base-metal layer is reduced.

26 Claims, 19 Drawing Sheets

METHOD AND APPARATUS FOR REDUCING HEAT ABSORPTION AROUND SOLDER PADS ON AN ELECTRICAL LEAD SUSPENSION

TECHNICAL FIELD

The present invention relates to the field of hard disk drive development, and more particularly to an apparatus and method reducing heat absorption around solder pads on an electrical lead suspension (ELS).

BACKGROUND ART

Hard disk drives are used in almost all computer system operations. In fact, most computing systems are not operational without some type of hard disk drive to store the most basic computing information such as the boot operation, the operating system, the applications, and the like. In general, the hard disk drive is a device which may or may not be removable, but without which the computing system will generally not operate.

The basic hard disk drive model was established approximately 50 years ago and resembles a phonograph. That is, the hard drive model includes a storage disk or hard disk that spins at a standard rotational speed. An actuator arm with a suspended slider is utilized to reach out over the disk. The arm carries a head assembly that has a magnetic read/write transducer or head for reading/writing information to or from a location on the disk. The complete head assembly, e.g., the suspension and head, is called a head gimbal assembly (HGA).

In operation, the hard disk is rotated at a set speed via a spindle motor assembly having a central drive hub. Additionally, there are tracks evenly spaced at known intervals across the disk. When a request for a read of a specific portion or track is received, the hard disk aligns the head, via the arm, over the specific track location and the head reads the information from the disk. In the same manner, when a request for a write of a specific portion or track is received, the hard disk aligns the head, via the arm, over the specific track location and the head writes the information to the disk.

Over the years, the disk and the head have undergone great reductions in their size. Much of the refinement has been driven by consumer demand for smaller and more portable hard drives such as those used in personal digital assistants (PDAs), MP3 players, and the like. For example, the original hard disk drive had a disk diameter of 24 inches. Modern hard disk drives are much smaller and include disk diameters of less than 2.5 inches (micro drives are significantly smaller than that). Advances in magnetic recording are also primary reasons for the reduction in size.

However, the decreased track spacing and the overall reduction in HDD component size and weight have resulted in problems with respect to the electrical lead suspension (ELS). Specifically, as the component sizes shrink, the conductive portions begin to move closer together both horizontally and vertically. As the conductive portions, e.g., electric traces, solder connections, layered components and the like, move closer to one another the conductive portions begin to interact negatively with one another. For example, there may be times of cross talk wherein one of the traces becomes electrically coupled with another of the traces or impedance issues when the layers form a parallel plate capacitor. In general, an ELS may be formed by a subtractive process, such as, e.g. an Integrated Lead Suspension (ILS), an additive process, such as, e.g., a Circuit Integrated suspension (CIS) or as a Flex-On Suspension (FOS) when the FOS is attached to a base metal layer, or it may be a Flex Gimbal Suspension Assembly (FGSA) that is attached to a base metal layer, or any form of lead suspension used in a DASD.

One solution to the problem of cross talk and the other disruptive interactions has been to lower the power requirements of the conductive portions. However, the power requirements can only be reduced to a minimum level. After the minimum operating level of the HDD is reached, no further power reduction can be realized without adversely affecting the operation of the HDD.

SUMMARY

An apparatus and method for reducing heat absorption around solder pads on an electrical lead suspension (ELS). The method provides a base-metal layer having at least one opening. A dielectric layer is also provided above the base-metal layer, the dielectric layer covering a portion of the base-metal layer and at least one of the openings in the base-metal layer. A signal conductive layer is provided above dielectric layer. The signal conductive layer carries at least one solder pad portion, wherein the solder pad portion is placed above the portion of the dielectric layer such that the solder pad portion does not align with the at least one opening in the base-metal layer. In so doing, the heat absorption with respect to the base-metal layer is reduced.

BRIEF DESCRIPTION OF THE DRAWINGS

(Prior Art)

BEST MODES FOR CARRYING OUT THE INVENTION

Reference will now be made in detail to the alternative embodiment(s)s of the present invention, an apparatus and method for reducing heat absorption around solder pads on an electrical lead suspension (ELS). While the invention will be described in conjunction with the alternative embodiment(s), it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

The discussion will begin with an overview of an electrical lead suspension (ELS) in conjunction with its operation within a hard disk drive and components connected therewith. For purposes of clarity, the overview embodiment will provide one of a plurality of possible termination pads connecting the ELS to the main flex package cable (FPC) setups. The discussion will then focus on embodiments of a method for reducing solder pad size in an ELS to decrease signal path capacitive discontinuities in particular.

Figure 1:
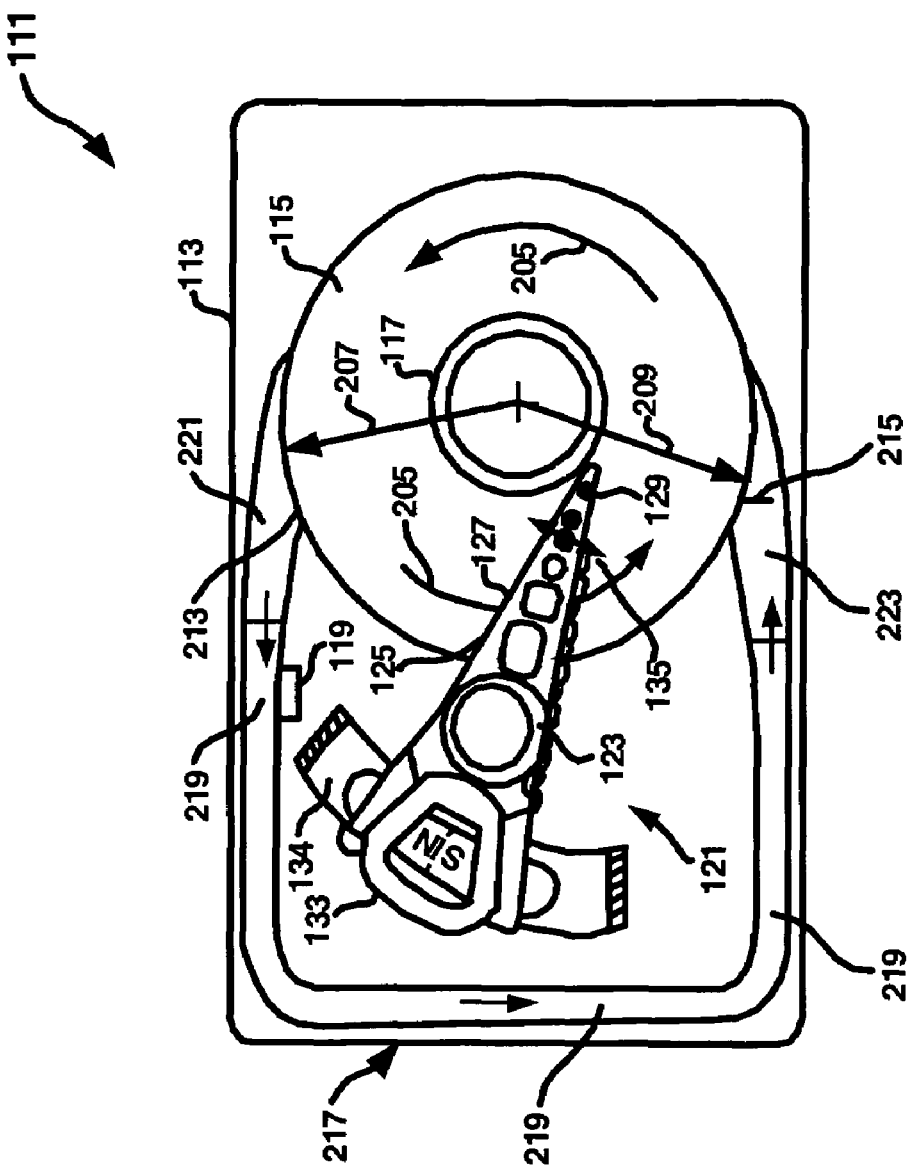
FIG. 1 is a schematic top plan view of a hard disk drive, in accordance with one embodiment of the present invention.

With reference now to FIG. 1, a schematic drawing of one embodiment of an information storage system comprising a magnetic hard disk file or drive 111 for a computer system is shown. Drive 111 has an outer housing or base 113 containing a disk pack having at least one media or magnetic disk 115. A spindle motor assembly having a central drive hub 117 rotates the disk or disks 115. An actuator 121 comprises a plurality of parallel actuator arms 125 (one shown) in the form of a comb that is movably or pivotally mounted to base 113 about a pivot assembly 123. A controller 119 is also mounted to base 113 for selectively moving the comb of arms 125 relative to disk 115.

In the embodiment shown, each arm 125 has extending from it at least one cantilevered (load beam removed) ELS 127. It should be understood that ELS 127 may be, in one embodiment, an integrated lead suspension (ILS) that is formed by a subtractive process. In another embodiment, ELS 127 may be formed by an additive process, such as a Circuit Integrated Suspension (CIS). In yet another embodiment, ELS 127 may be a Flex-On Suspension (FOS) attached to base metal or it may be a Flex Gimbal Suspension Assembly (FGSA) that is attached to a base metal layer. The ELS may be any form of lead suspension that can be used in a Data Access Storage Device, such as a HDD. A magnetic read/write transducer or head is mounted on a slider 129 and secured to a flexure that is flexibly mounted to each ELS 127. The read/write heads magnetically read data from and/or magnetically write data to disk 115. The level of integration called the head gimbal assembly is the head and the slider 129, which are mounted on suspension 127. The slider 129 is usually bonded to the end of ELS 127.

ELS 127 has a spring-like quality, which biases or presses the air-bearing surface of the slider 129 against the disk 115 to cause the slider 129 to fly at a precise distance from the disk. ELS 127 has a hinge area that provides for the spring-like quality, and a flexing interconnect (or flexing interconnect) that supports read and write traces through the hinge area. A voice coil 133, free to move within a conventional voice coil motor magnet assembly 134 (top pole not shown), is also mounted to arms 125 opposite the head gimbal assemblies. Movement of the actuator 121 (indicated by arrow 135) by controller 119 causes the head gimbal assemblies to move along radial arcs across tracks on the disk 115 until the heads settle on their set target tracks. The head gimbal assemblies operate in a conventional manner and always move in unison with one another, unless drive 111 uses multiple independent actuators (not shown) wherein the arms can move independently of one another.

Although embodiments of the present invention are described in the context of an ELS in an information storage system, it should be understood that embodiments may apply to any device utilizing an electrical interconnect that might experience signal loss and cross-talk between signal traces. For example, embodiments of the present invention may apply to rigid printed circuit boards. More specifically, embodiments of the present invention may be used in printed circuit boards that are used for high speed signal processing. Embodiments of the present invention are also suitable for use in flexing circuits, e.g., flexing circuits for digital cameras and digital camcorders. The signal traces may also be replaced with power traces according to one embodiment.

Figure 2:
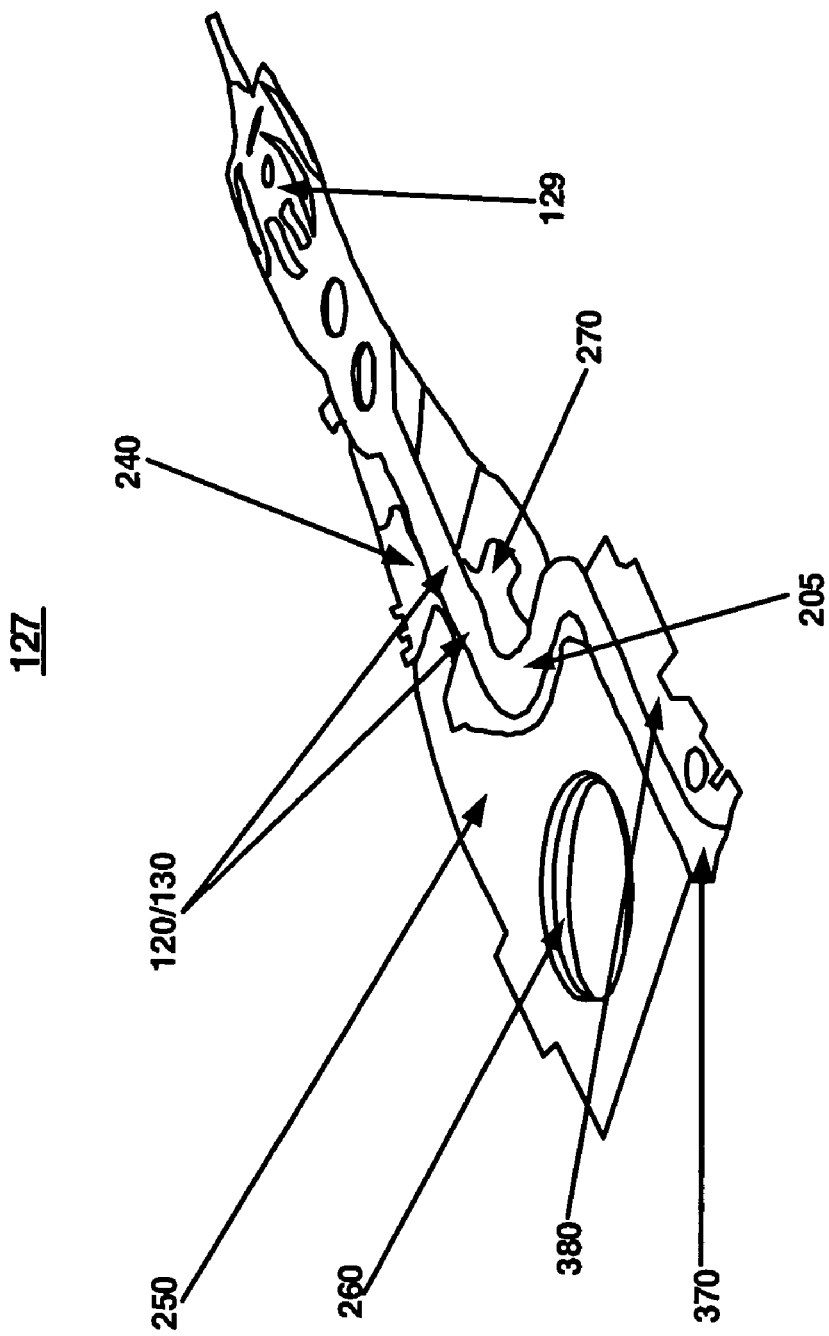
FIG. 2 is a top plan view of an exemplary electrical lead suspension (ELS) according to one embodiment of the present invention.

Referring now to FIG. 2, a top plan view of an exemplary electrical lead suspension (ELS) according to one embodiment of the present invention. The read and write traces, 120 and 130, pass through the hinge center 270 of ELS 127, where load beam 240 connects, via hinge plate 250, to mount plate 260, according to one embodiment of the present invention. Slider 129 resides toward the end of ELS 127, and contains the read/write head. Slider 129 is bonded to read and write traces 120 and 130, where read and write signals are carried to and from the read/write head.

Flexing interconnect 200 of ELS 127 can be formed from a laminate that is, according to one embodiment, of at least three layers, of materials. A signal-conductor layer may be a highly conductive metal, e.g., copper, from which the read and write traces 120 and 130 are formed. A middle layer 370 can be an insulating dielectric layer, e.g., polyimide, separating the top layer from which write and read traces 120 and 130 are formed from a base metal layer 380, such as stainless steel from which serpentine patterns are formed. Although an ELS having a flexing interconnect is shown, it is appreciated that the present invention may be implemented on a plurality of ELS configurations including ELS having more or fewer components than the exemplary ELS described herein.

Figure 3:
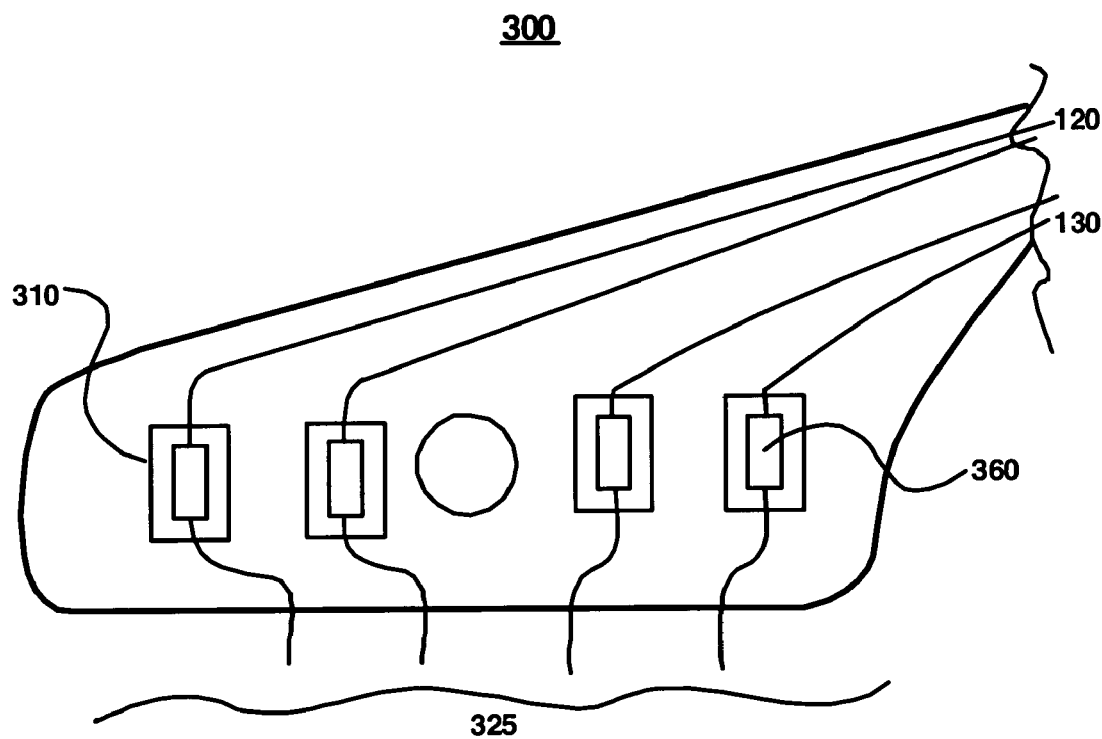
FIG. 3 is a top view of the exemplary ELS having reduced solder pad size in accordance with one embodiment of the present invention.

With reference now to FIG. 3, a top view of an exemplary ELS having a reduced solder pad portion is shown in accordance with one embodiment of the present invention. In general, the portion of the ELS shown is the termination pads connection the ELS to the main flex-package-cable. In one embodiment, the ELS portion 300 has at least one (in this example 4) solder pad(s) 310. The solder pads 310 are utilized as the location to perform the coupling of the ELS to the main flex-package-cable 325. In one embodiment, the solder pad(s) 310 is a feature of the signal-conductor layer which also includes read/write traces 120 and 130.

Figure 4:
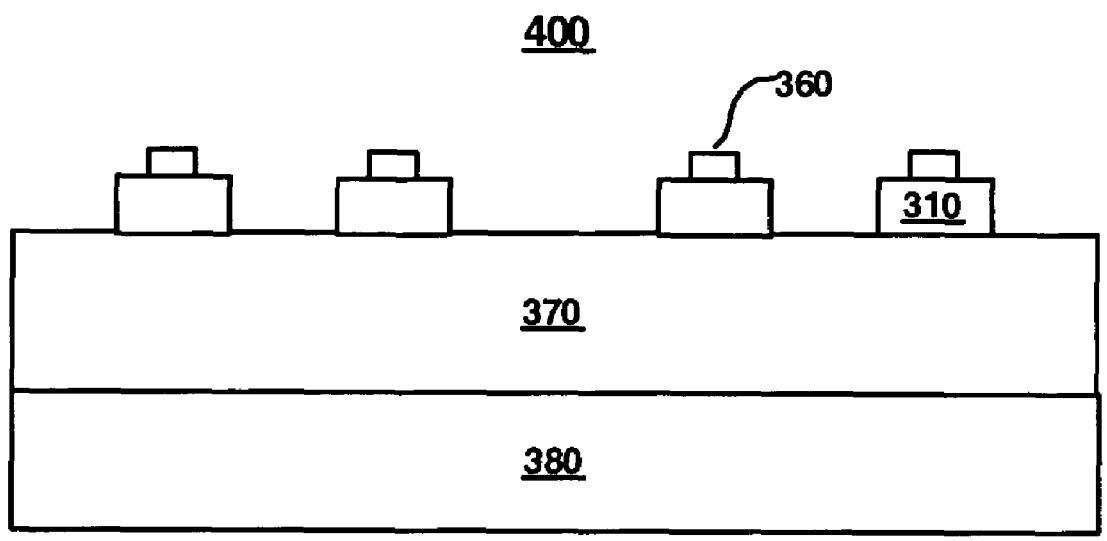
FIG. 4 is a side cut-away view of the exemplary ELS having reduced solder pad size in accordance with one embodiment of the present invention.

Referring now to FIG. 4, a side cut-away view 400 of an exemplary ELS having reduced solder pad size is shown in accordance with one embodiment of the present invention. Side cut-away view 400 shows an embodiment of a four level ELS. That is, an ELS having a base-metal layer 380, a dielectric layer 370, a signal conductive layer with solder pad 310, and a solder 360. Side cut-away view 400 also shows the solder 360 residing on the signal conductive layer solder pad 310.

Figure 5:
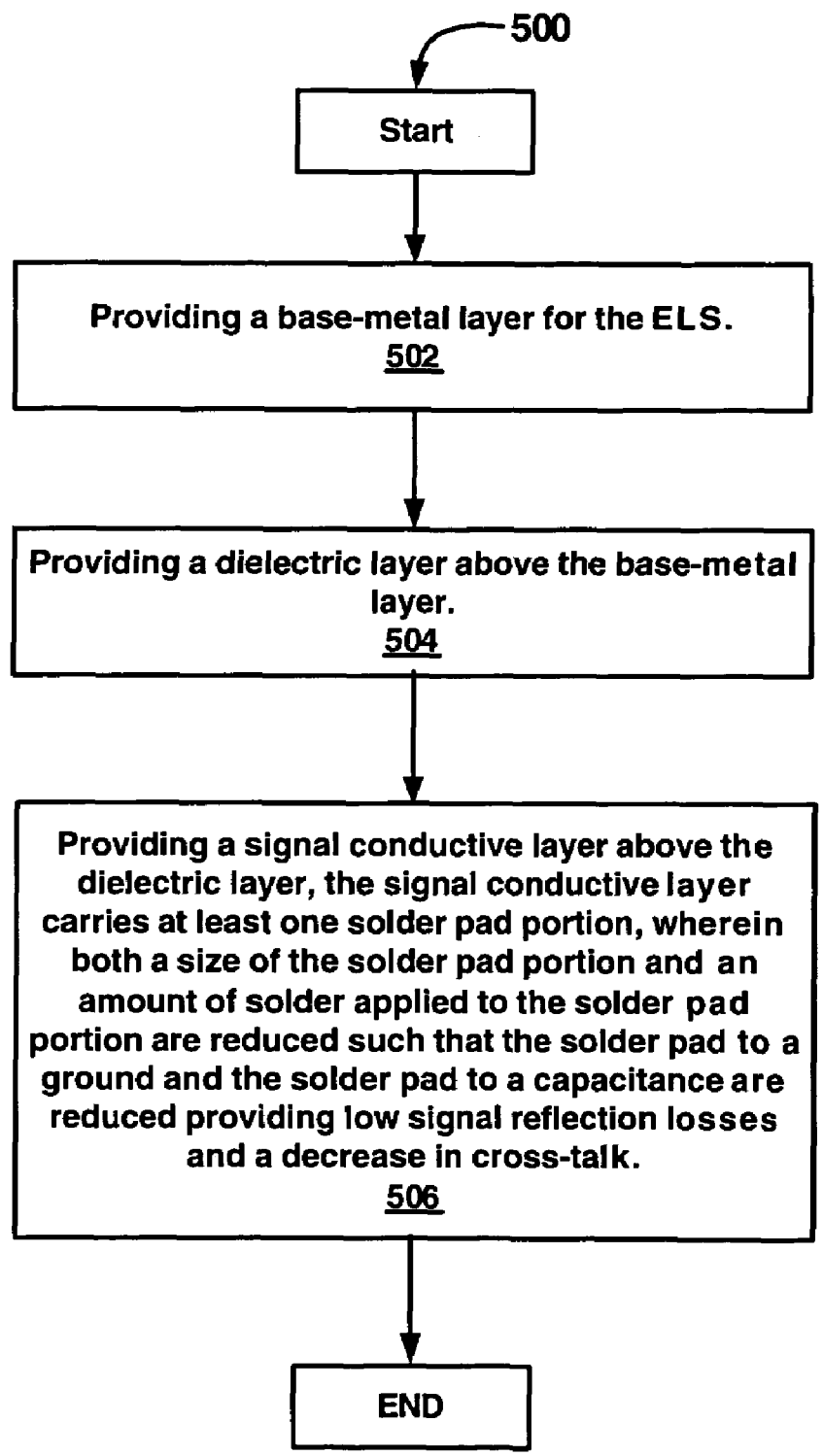
FIG. 5 is a flowchart of a method for reducing solder pad size in an ELS to decrease signal path capacitive discontinuities in accordance with one embodiment of the present invention.

With reference now to FIG. 5, a flowchart of a method for reducing solder pad size and solder volume in an ELS to decrease signal path capacitive discontinuities is shown in accordance with one embodiment of the present invention. In general, the solder pad is reduced in size and the interconnect solder volume is reduced. For example, in one embodiment, the solder 360 volume is reduced between 2 and 6 times, while the size of the solder pad portion 310 is reduced from Approximately 350 microns by 850 microns to approximately 200 microns by 475 microns. Although, specific measurements are given, it is appreciated that the reduced solder pad portion 310 may be significantly altered including the use of a plurality of geometric shapes while still remaining within the scope of the invention.

By reducing the size of the solder pad portion(s) 310 and the amount of solder 360 utilized thereon, a large reduction in solder pad portion 310 to base metal 380 capacitance is achieved. That is, by reducing the size of one of the conductive portions of the ELS construct (e.g., as shown in side-view 400), the plate capacitance of the ELS construct 400 is greatly reduced. Moreover, due to the reduction of the capacitance, the impedance is greatly increased. Therefore, a reduction in signal path capacitive discontinuities is realized and the signal waveform is maintained across the solder pad connection.

Referring now to step 502 of FIG. 5 and to FIG. 4, one embodiment provides a base-metal layer 380 for the ELS 400. That is, the portion of the ELS shown in diagram 400 initially incorporates a bottom or base-metal layer 380 as the foundation upon which to build the structure 400. In one embodiment, the base-metal layer 380 is stainless steel. In operation, the stainless steel base-metal layer 380 is utilized to provide the necessary support and an electrical ground to the overall structure of the ELS as shown in FIG. 2. Although stainless steel is stated herein as the base-metal layer, it is appreciated that a plurality of metals may be utilized as the base-metal layer 380.

Referring now to step 504 of FIG. 5 and to FIG. 3, one embodiment provides a dielectric layer 370 above the base-metal layer 380. In one embodiment, the dielectric layer 370 is a polyimide layer. In operation, the dielectric layer 370 is utilized to provide an electrical insulative layer between the base-metal layer 380 and the signal conductive layer 310, such as solder pad(s) 360, electric traces 120 and 130 of FIG. 2, and the like. Although polyimide is stated herein as the dielectric layer 370, it is appreciated that a plurality of non-conductive layers may be utilized as the dielectric layer 370 without significantly affecting the characteristics thereof.

Referring now to step 506 of FIG. 5 and to FIG. 3, one embodiment provides a signal conductive layer above the dielectric layer. The signal conductive layer carries at least one solder pad portion 310 above a portion of the dielectric layer 370, wherein the size of the solder pad portion 310 is reduced. In so doing, the solder pad 310 to a ground capacitance are reduced thereby providing low signal reflection losses and a decrease in cross-talk. In other words, as stated herein, by reducing the size of the solder pad portion(s) 310 a significant reduction in solder pad portion 310 to base metal 380 capacitance is achieved.

In another embodiment, the amount of solder 360 applied to the reduced solder pad portion 310 is also reduced. In so doing, the solder 360 on the first solder pad to solder on the adjacent solder pads capacitance is reduced thereby providing further lower signal reflection losses and cross-talk. In other words, as stated herein, by reducing the size of the solder pad portion(s) 310 and the amount of solder 360 used on the solder pad portion(s) 310, a large reduction in solder pad portion 310 to base metal 380 capacitance is achieved.

Therefore, by reducing the size of one of the conductive portions of the ELS construct (e.g., as shown in side-view 400), the plate capacitance of the ELS construct 400 (e.g., base-metal 380 to solder pad portion 310) is greatly reduced. Moreover, due to the reduction of the capacitance, the impedance is greatly increased. Thus, a reduction in signal path capacitive discontinuities is realized and the signal waveform is maintained across the solder pad connection.

In one embodiment, the solder pad portion 310 of the signal-conductor layer is formed from copper. Although copper is stated herein, it is appreciated that the solder pad portion 310 may be formed from other conductors such as silver, gold, or the like or combination thereof. The use of copper in the description is merely for purposes of clarity. Moreover, the solder pad portion 310 of the signal conductive layer may be provided above a portion of the dielectric layer 370 via a plurality of methods which are well known in the art.

Opening in Base Metal Layer Below Solder-Pad

Figure 6:
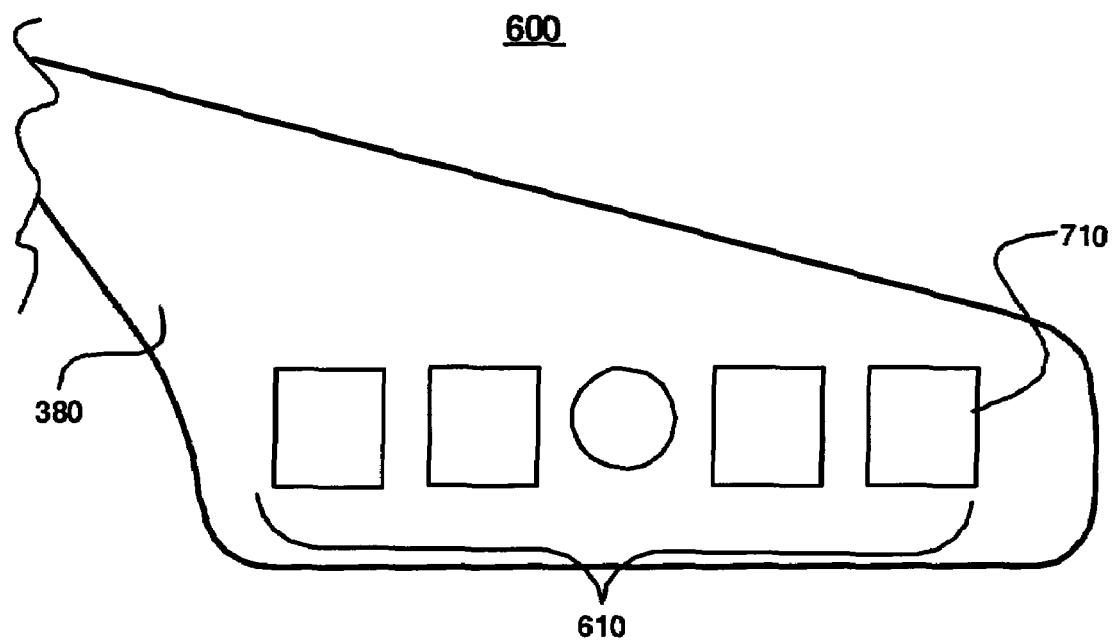
FIG. 6 is a bottom view of the exemplary ELS having openings in the base-metal layer under the solder pad portion in accordance with one embodiment of the present invention.

Referring now to FIG. 6, a bottom view of an exemplary ELS having openings in the base-metal layer under the solder pad portion is shown in accordance with one embodiment of the present invention. In general, the portion of the ELS shown is the base-metal portion 380 with holes 610 formed under the location wherein the termination pads connection the ELS to the main flex-package-cable. In one embodiment, the ELS portion 600 has at least one (in this example 4) solder pad(s) 710 (shown in side cut-away view 700 of FIG. 7). The solder pads 710 are utilized as the location to perform the coupling of the ELS to the main flex-package-cable as shown in FIG. 2. Solder pads 710 are the standard solder pad(s) e.g., approx. 350 microns by approx. 850 microns. They are not the reduced size solder pads such as those described herein.

Figure 7:
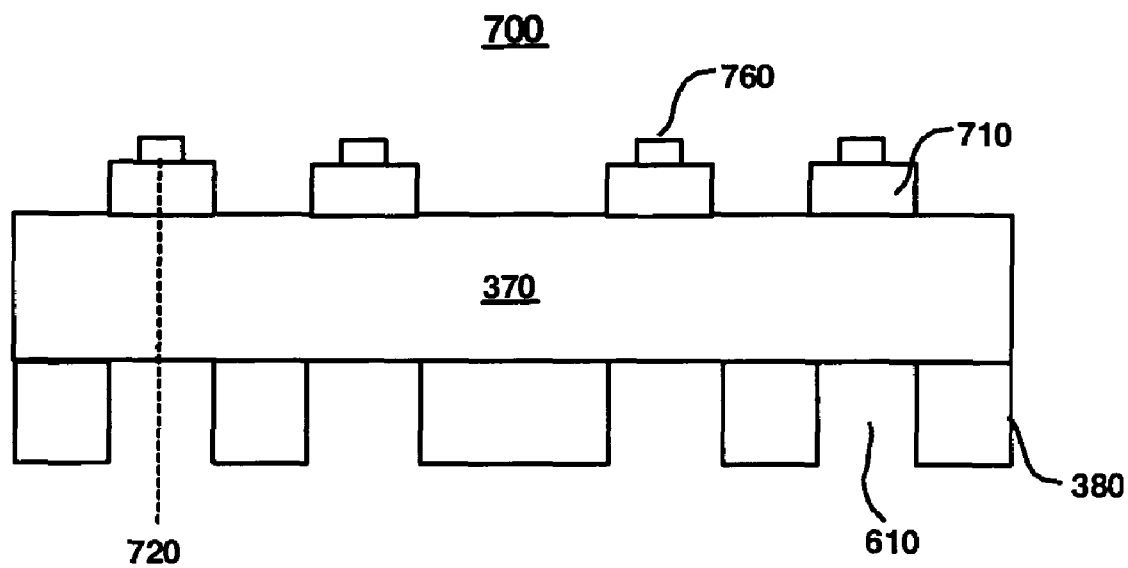
FIG. 7 is a side cut-away view of the exemplary ELS having openings in the base-metal layer under the solder pad portion in accordance with one embodiment of the present invention.

Referring now to FIG. 7, a side cut-away view of the exemplary ELS having openings in the base-metal layer under the solder pad portion is shown in accordance with one embodiment of the present invention. Side cut-away view 700 shows an embodiment of a three level ELS. That is, an ELS having a base-metal layer 380 with holes 610 therein, a dielectric layer 370 and a signal conductive layer carrying solder pad portion 710. Side cut-away view 400 also shows the solder 760 residing on solder pad 710.

Figure 8:
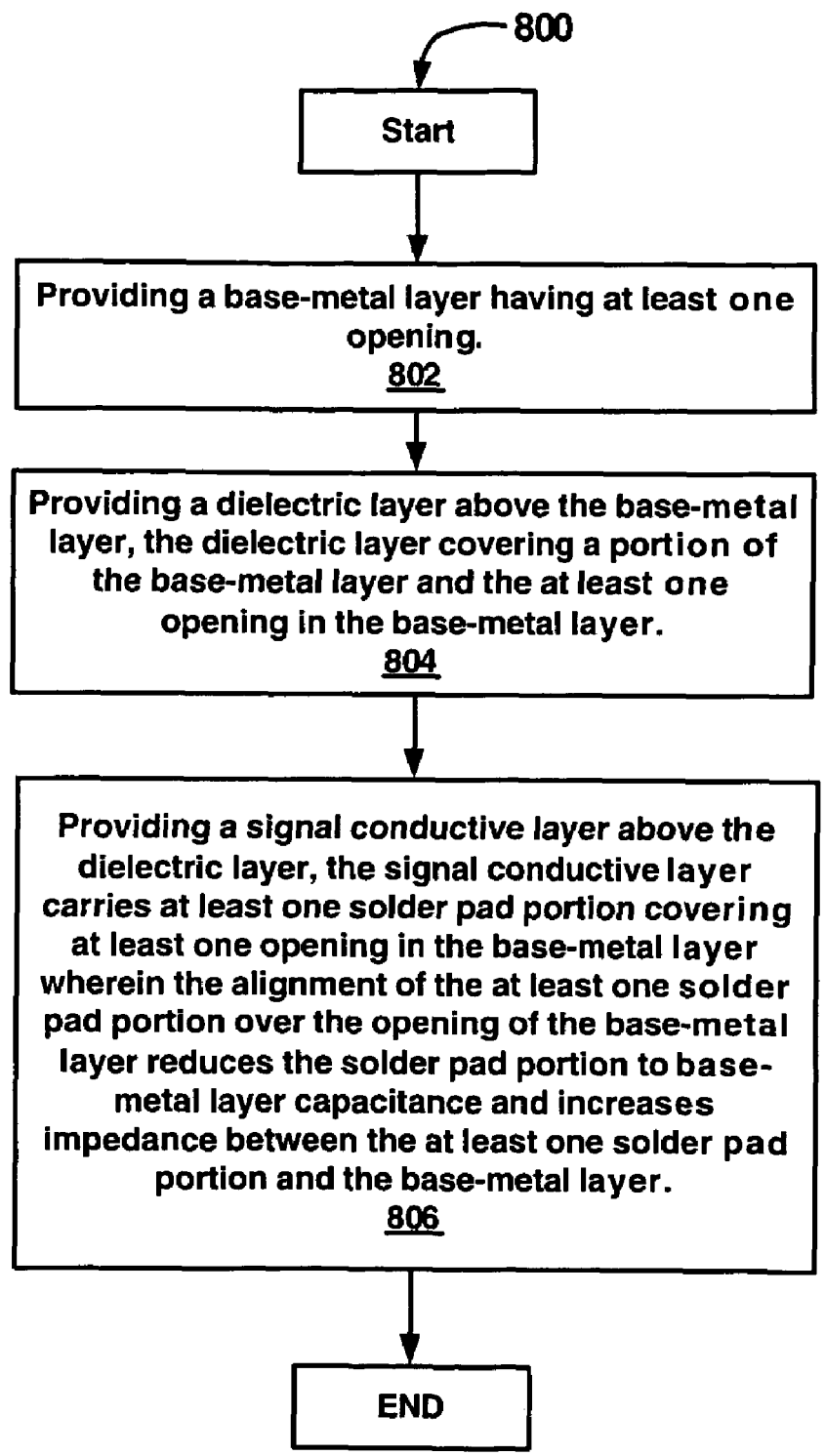
FIG. 8 is a flowchart of a method for forming an opening in a base-metal layer of an ELS under the solder pad portion in accordance with one embodiment of the present invention.

With reference now to FIG. 8 and to FIG. 7, a flowchart of a method for forming an opening in a base-metal layer 380 of an ELS under the solder pad portion 710 is shown in accordance with one embodiment of the present invention. In general, the solder pad portion 710 is a standard solder pad portion 710 having the standard amount of solder thereon. Although solder pad portion 710 is the standard size, it may be significantly altered including the use of a plurality of geometric shapes while still remaining within the scope of the invention.

By introducing holes 610 in the base-metal layer 380, a significant reduction in solder pad portion 710 to base metal 380 capacitance is achieved. That is, by reducing the size of one of the conductive portions of the ELS construct (e.g., removing the base-metal below the solder pad as shown in side-view 600), the plate capacitance of the ELS construct 600 is greatly reduced. Moreover, due to the reduction of the capacitance, the impedance is greatly increased. Therefore, a reduction in signal path capacitive discontinuities is realized and the signal waveform is maintained across the solder pad connection.

Referring now to step 802 of FIG. 8 and to FIG. 7, one embodiment provides a base-metal layer 380 for the ELS 700 having at least one opening 610 therein. That is, the portion of the ELS shown in diagram 700 initially incorporates a bottom or base-metal layer 380 as the foundation upon which to build the structure 700. Moreover, at least one hole 610 is formed in the base-metal layer 380 that does not significantly impact the strength of the base-metal layer foundation for the ELS. In another embodiment, a plurality of holes 610 is formed in the base-metal layer 380 to coincide with a plurality of solder pads 710.

In one embodiment, the base-metal layer 380 is stainless steel. In operation, the stainless steel base-metal layer 380 is utilized to provide the necessary support to the overall structure of the ELS as shown in FIG. 2. Although stainless steel is stated herein as the base-metal layer, it is appreciated that a plurality of metals may be utilized as the base-metal layer 380. In general, the holes 610 in the base-metal layer 380 may be formed by a methods such as cutting, milling, grinding, molding, injecting, stamping, etching, or the like. That is, the method for placing the holes 610 in the base-metal layer 380 may be any of the plurality of metal-hole making methods known in the art.

Referring now to step 804 of FIG. 8 and to FIG. 7, one embodiment provides a dielectric layer 370 above the base-metal layer 380. The dielectric layer 370 covers a portion of the base-metal layer 380 and the at least one hole 610 in the base-metal layer 380. In one embodiment, the dielectric layer 370 is a polyimide layer. In operation, the dielectric layer 370 is utilized to provide an electrical insulative layer between the base-metal layer 380 and the signal conductive layer carrying solder pad portion 710, the electric traces 120 and 130 of FIG. 2, and the like. Although polyimide is stated herein as the dielectric layer 370, it is appreciated that a plurality of non-conductive layers may be utilized as the dielectric layer 370 without significantly affecting the characteristics thereof.

Referring now to step 806 of FIG. 8 and to FIG. 7, one embodiment provides a signal conductive layer above the dielectric layer. The signal conductive layer carries at least one solder pad portion 710 above a portion of the dielectric layer 370, the solder pad portion 710 aligned 720 above the dielectric layer 370 covering the at least one opening 610 in the base-metal layer 380. In one embodiment, the alignment 720 of the at least one solder pad portion 710 over the opening of the base-metal layer 380 reduces the solder pad portion 710 to base-metal layer 380 capacitance and increases impedance between the at least one solder pad portion 710 and the base-metal layer 380.

Therefore, by reducing the size of one of the conductive portions of the ELS construct, e.g., by removing a portion of base-metal layer 380 as shown in side-view 700, the plate capacitance of the ELS construct 700 (e.g., base-metal 380 to solder pad portion 710) is greatly reduced. Moreover, due to the reduction of the capacitance, the impedance is greatly increased. Thus, a reduction in signal path capacitive discontinuities is realized and the signal waveform is maintained across the solder pad connection.

In one embodiment, the solder pad portion 710 is a portion of signal-conductor layer. For example, in one embodiment the solder pad portion 710 is formed from copper. Although copper is stated herein, it is appreciated that the solder pad portion 710 may be formed from other conductors such as silver, gold, or the like. The use of copper in the description is merely for purposes of clarity. Moreover, the solder pad portion 710 may be provided above a portion of the dielectric layer 370 via a plurality of methods which are well known in the art.

Combined Solder Pad Reduction/Opening in Base-Metal Layer

Figure 9:
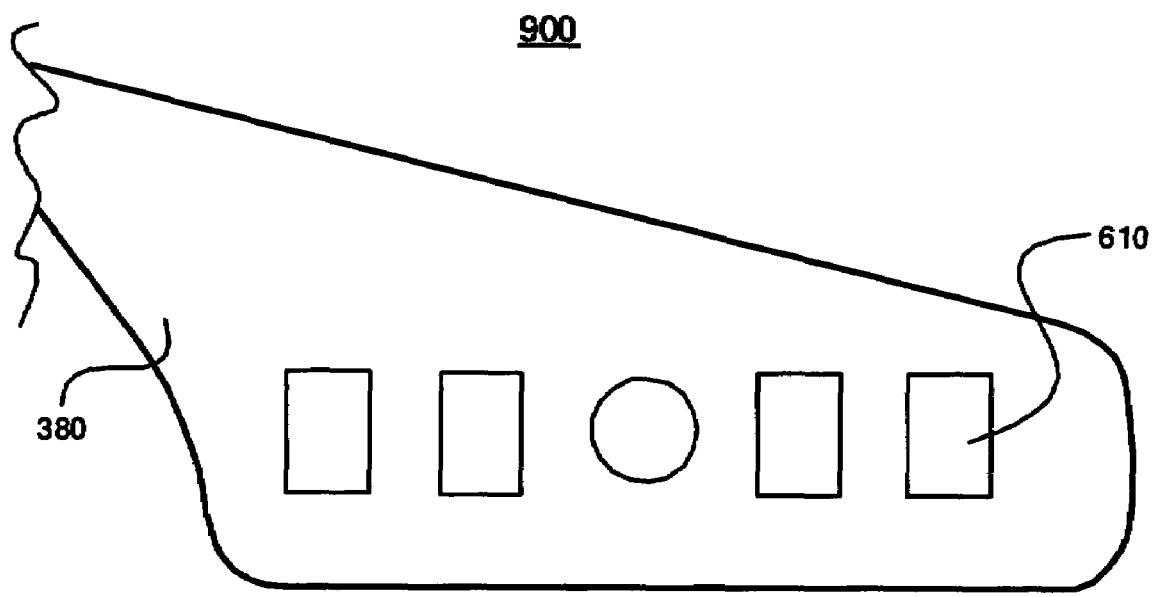
FIG. 9 is a bottom view of the exemplary ELS having reduced solder pad size and openings in the base-metal layer under the solder pad portion in accordance with one embodiment of the present invention.

With reference now to FIG. 9, a bottom view of the exemplary ELS having reduced solder pad size and openings in the base-metal layer under the solder pad portion is shown in accordance with one embodiment of the present invention. In general, the portion of the ELS shown is the base-metal portion 380 with holes 610 formed under the location wherein the termination pads connection the ELS to the main flex-package-cable. In one embodiment, the ELS portion 900 has at least one (in this example 4) solder pad(s) 310 (shown in side cut-away view 1000 of FIG. 10). The solder pads 310 are utilized as the location to perform the coupling of the ISL to the main flex-package-cable 325.

Figure 10:
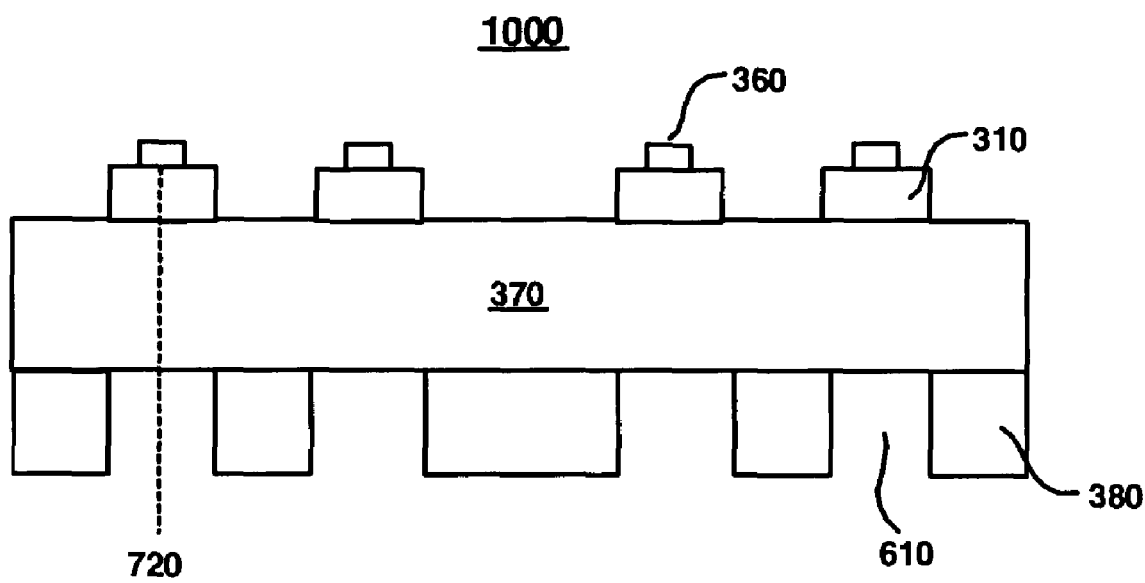
FIG. 10 is a side cut-away view of the exemplary ELS having openings in the base-metal layer under a reduced size solder pad portion in accordance with one embodiment of the present invention.

Referring now to FIG. 10, a side cut-away view of the exemplary ELS having openings in the base-metal layer under a reduced size solder pad portion is shown in accordance with one embodiment of the present invention. Side cut-away view 1000 shows an embodiment of a three level ELS. That is, an ELS having a base-metal layer 380 with holes 610 therein, a dielectric layer 370 and a signal conductive layer carrying solder pad portion 310. Side cut-away view 1000 also shows the solder 360 residing on a signal conductive layer carrying solder pad 310.

Figure 11:
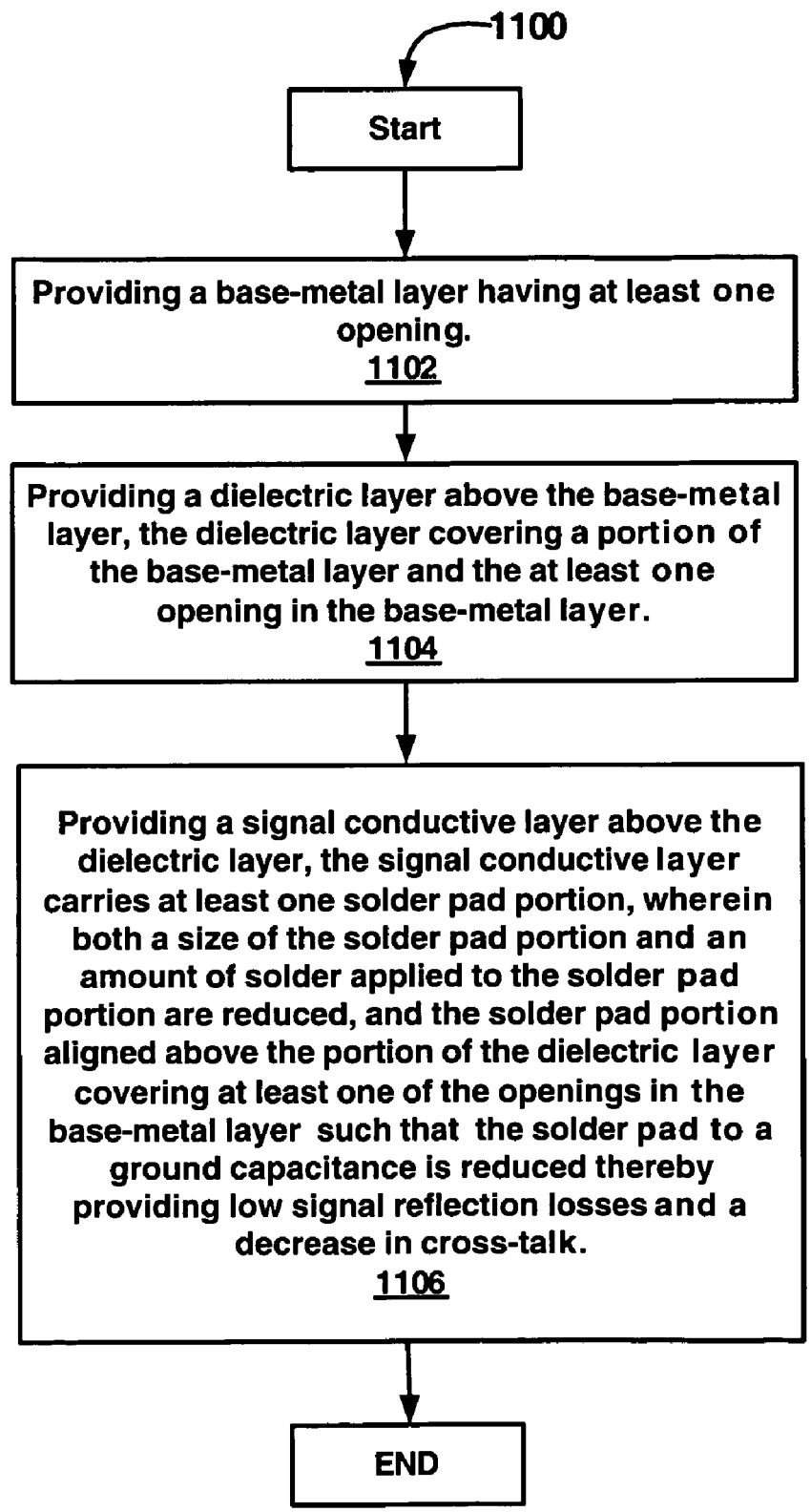
FIG. 11 is a flowchart of a method for forming an opening in a base-metal layer of an ELS under a reduced size solder pad portion in accordance with one embodiment of the present invention.

With reference now to FIG. 11, a flowchart of a method for forming an opening in a base-metal layer of an ELS under a reduced size solder pad portion is shown in accordance with one embodiment of the present invention. In general, as described herein, the solder pad is reduced in size and the interconnect solder volume is reduced. For example, in one embodiment, the solder 360 volume is reduced between 2 and 5 times, while the size of the solder pad portion 310 is reduced to approximately 200 microns by 475 microns. Although, specific measurements are given, it is appreciated that the reduced solder pad portion 310 may be significantly altered including the use of a plurality of geometric shapes while still remaining within the scope of the invention.

By reducing the size of the solder pad portion(s) 310 and the amount of solder 360 utilized thereon, a significant reduction in solder pad portion 310 to base metal 380 capacitance is achieved. Moreover, by introducing holes 610 in the base-metal layer 380, a significant reduction in solder pad portion 310 to base metal 380 capacitance is also achieved. That is, by reducing the size of both of the conductive portions of the ELS construct, e.g., removing the base-metal below the solder pad as shown in side-view 1000 and reducing the size of the solder pad 310, the plate capacitance of the ELS construct 1000 is greatly reduced. Moreover, due to the reduction of the capacitance, the impedance is greatly increased. Therefore, a reduction in signal path capacitive discontinuities is realized and the signal waveform is maintained across the solder pad connection.

Referring now to step 1102 of FIG. 11 and to FIG. 10, one embodiment provides a base-metal layer 380 for the ELS 1000 having at least one opening 610 therein. That is, the portion of the ELS shown in diagram 1000 initially incorporates a bottom or base-metal layer 380 as the foundation upon which to build the structure 1000. Moreover, at least one hole 610 is formed in the base-metal layer 380 that does not significantly impact the strength of the base-metal layer foundation for the ELS. In another embodiment, a plurality of holes 610 is formed in the base-metal layer 380 to coincide with a plurality of solder pads 310.

In one embodiment, the base-metal layer 380 is stainless steel. In operation, the stainless steel base-metal layer 380 is utilized to provide the necessary support and an electrical ground to the overall structure of the ELS as shown in FIG. 2. Although stainless steel is stated herein as the base-metal layer, it is appreciated that a plurality of metals may be utilized as the base-metal layer 380. In general, the holes 610 in the base-metal layer 380 may be formed by a methods such as cutting, milling, grinding, molding, injecting, stamping, etching, or the like. That is, the method for placing the holes 610 in the base-metal layer 380 may be any of the plurality of metal-hole making methods known in the art.

Referring now to step 1104 of FIG. 11 and to FIG. 10, one embodiment provides a dielectric layer 370 above the base-metal layer 380. The dielectric layer 370 covers a portion of the base-metal layer 380 and the at least one hole 610 in the base-metal layer 380. In one embodiment, the dielectric layer 370 is a polyimide layer. In operation, the dielectric layer 370 is utilized to provide an electrical insulative layer between the base-metal layer 380 and the signal conductive layer 310 such as the solder pad(s) 360, the electric traces 120 and 130 of FIG. 2, and the like. Although polyimide is stated herein as the dielectric layer 370, it is appreciated that a plurality of non-conductive layers may be utilized as the dielectric layer 370 without significantly affecting the characteristics thereof.

Referring now to step 1106 of FIG. 11 and to FIG. 10, one embodiment provides a signal conductive layer above the dielectric layer. The signal conductive layer carries at least one solder pad portion 310 above a portion of the dielectric layer 370 wherein both the size of the solder pad portion 310 and the amount of solder 360 applied to the solder pad portion 370 are reduced and the solder pad portion 310 is further aligned 720 above the dielectric layer 370 covering the at least one opening 610 in the base-metal layer 380. In one embodiment, by reducing the size of the solder pad portion(s) 310 and the amount of solder 360 used on the solder pad portion(s) 310, a significant reduction in solder pad portion 310 to base metal 380 capacitance is achieved. Moreover, by aligning the at least one solder pad portion 310 over the opening of the base-metal layer 380 a further reduction in the solder pad portion 310 to base-metal layer 380 capacitance is achieved as well as an increase in impedance between the at least one solder pad portion 310 and the base-metal layer 380. Thereby providing low signal reflection losses and a decrease in cross talk.

In other words, by reducing the size of both of the conductive portions of the ELS construct (e.g., as shown in side-view 1000), the plate capacitance of the ELS construct 1000 (e.g., base-metal 380 to solder pad portion 310) is greatly reduced. Moreover, due to the reduction of the capacitance, the impedance is greatly increased. Thus, a reduction in signal path capacitive discontinuities is realized and the signal waveform is maintained across the solder pad connection.

In one embodiment, the solder pad portion 310 of the signal-conductor layer is formed from copper. Although copper is stated herein, it is appreciated that the solder pad portion 310 may be formed from other conductors such as silver, gold, or the like or combinations thereof. The use of copper in the description is merely for purposes of clarity. Moreover, the solder pad portion 310 of the signal conductive layer may be provided above a portion of the dielectric layer 370 via a plurality of methods which are well known in the art.

Reducing Heat Absorption

Figure 12:
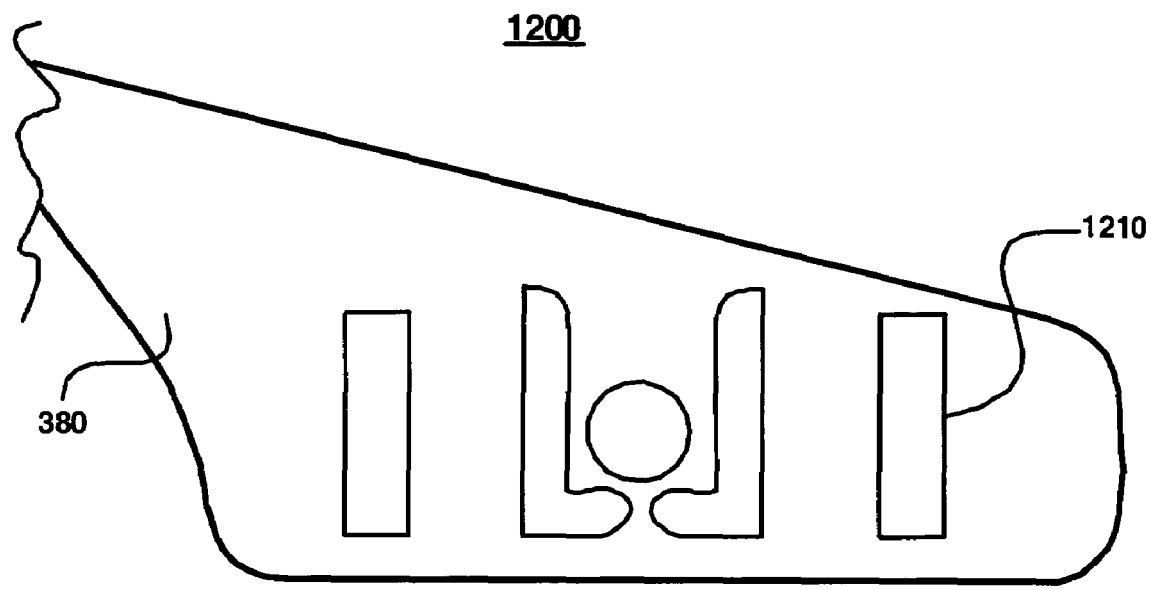
FIG. 12 is a bottom view of the exemplary ELS having openings in the base-metal layer between a solder pad portion in accordance with one embodiment of the present invention.

With reference now to FIG. 12, a bottom view of the exemplary ELS having openings 1210 in the base-metal layer 380 between a solder pad portion 310 is shown in accordance with one embodiment of the present invention. In general, the portion of the ELS shown is the base-metal portion 380 with holes 1210 formed in the base-metal layer 380 in a non-aligned fashion with the solder pad(s) 310, in the location wherein the termination pads connection the ELS to the main flex-package-cable. In one embodiment, the ELS portion 1200 has at least one (in this example 4) solder pad(s) 310 (shown in side cut-away view 1300 of FIG. 13). The solder pads 310 are utilized as the location to perform the coupling of the ISL to the main flex-package-cable (as shown in FIG. 3).

Figure 13:
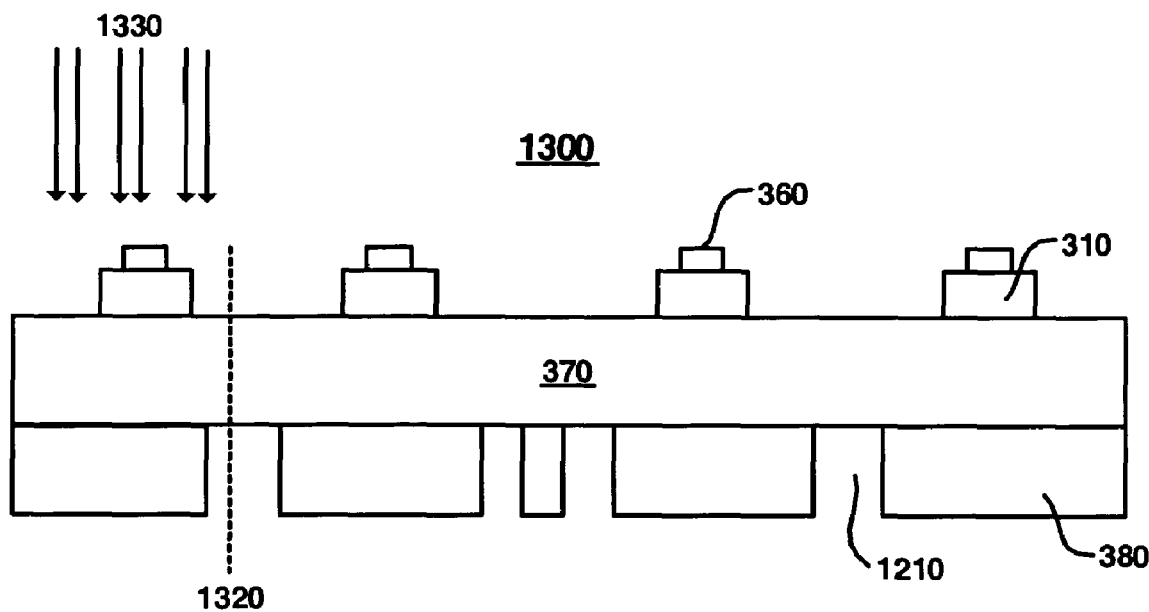
FIG. 13 is a side cut-away view of the exemplary ELS having openings in the base-metal layer between a solder pad portion in accordance with one embodiment of the present invention.

Referring now to FIG. 13, a side cut-away view of the exemplary ELS having openings in the base-metal layer between a solder pad portion is shown in accordance with one embodiment of the present invention. Side cut-away view 1300 shows an embodiment of a three level ELS. That is, an ELS having a base-metal layer 380 with holes 610 therein, a dielectric layer 370 and a signal conductive layer carrying solder pad portion 310. Side cut-away view 1300 also shows the solder 360 residing on solder pad 310. In FIG. 13, the alignment 1320 of the openings 1210 in the base-metal layer 380 are shown to be not underneath the solder pad portion 310, but instead aligned underneath portions of the dielectric layer 370 not having a solder pad portion 310 thereabove.

Figure 14:
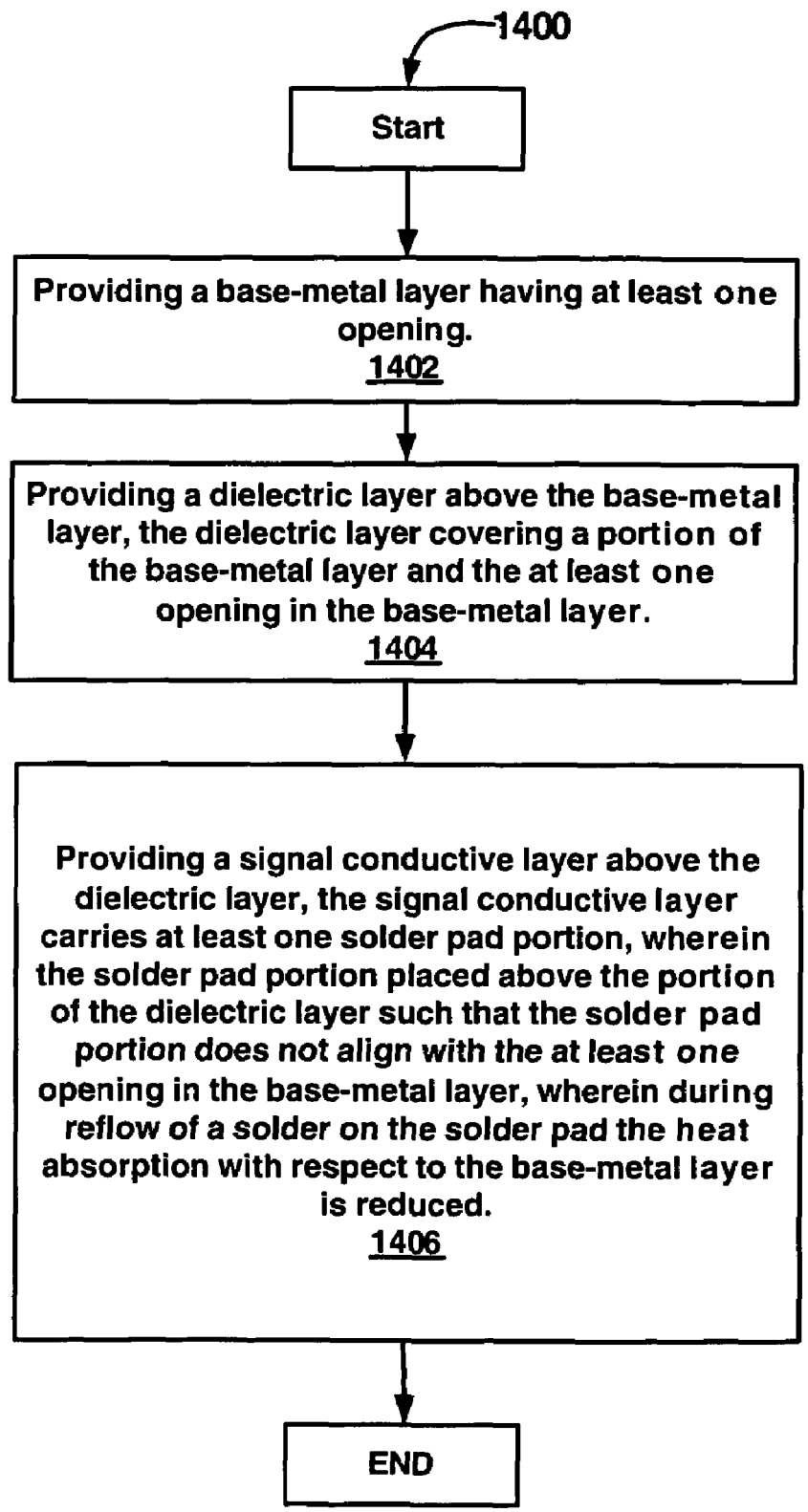
FIG. 14 is a bottom view of the exemplary ELS having openings in the base-metal layer under the solder pad portion and between the solder pad portion in accordance with one embodiment of the present invention.

With reference now to FIG. 14 and to FIG. 13, a flowchart 1400 of a method for reducing heat absorption between a solder pad portion of an ELS is shown in accordance with one embodiment of the present invention. By introducing holes 1210 in the base-metal layer 380 around the at least one solder pad portion 310, a significant reduction in heat absorption of the base metal layer 380 is achieved. In other words, when the solder 360 on the solder pad portion 310 is heated to cause a reflow (e.g., via infrared heating 1330 or the like), some of the heat passes around the solder pad portion 310 through the dielectric layer 370 and contacts the base-metal layer 380. At that time, the base-metal layer 380 will begin to heat up and provide additional radiant heat to the dielectric layer 370 causing bubbling problems, or even greater damage to the dielectric layer 370.

By removing a portion of the base-metal layer 380, that is, openings 1210, the heat 1330 utilized for the reflow process will be able to flow through the dielectric layer 370 and pass harmlessly through the openings 1210 in the base-metal layer 380. The importance of the removed openings 1210 in the base-metal layer 380 is even more evident when the solder pad portion 310 is reduced in size. For example, in one embodiment, the solder 360 volume is reduced between 2 and 5 times, while the size of the solder pad portion 310 is reduced to approximately 200 microns by 475 microns. Although, specific measurements are given, it is appreciated that the reduced solder pad portion 310 may be significantly altered including the use of a plurality of geometric shapes while still remaining within the scope of the invention. That is, when the copper pad portion 310 is reduced in size (as described in detail herein) the amount of heating 1330 passing around the copper pad portion 310 is increased. As such, the importance of providing the openings 1210 in the base-metal layer 380 to protect the dielectric layer 370 is also increased.

Referring now to step 1402 of FIG. 14 and to FIG. 13, one embodiment provides a base-metal layer 380 for the ELS 1300 having at least one opening 610 therein. That is, the portion of the ELS shown in diagram 1300 initially incorporates a bottom or base-metal layer 380 as the foundation upon which to build the structure 1300. Moreover, at least one hole 1210 is formed in the base-metal layer 380 that does not significantly impact the strength of the base-metal layer 380 foundation for the ELS. In another embodiment, a plurality of holes 1210 are formed in the base-metal layer 380 to coincide with a plurality of solder pads 310.

In one embodiment, the base-metal layer 380 is stainless steel. In operation, the stainless steel base-metal layer 380 is utilized to provide the necessary support and an electrical ground to the overall structure of the ELS as shown in FIG. 2. Although stainless steel is stated herein as the base-metal layer, it is appreciated that a plurality of metals may be utilized as the base-metal layer 380. In general, the holes 1210 in the base-metal layer 380 may be formed by a methods such as cutting, milling, grinding, molding, injecting, stamping, etching, or the like. That is, the method for placing the holes 1210 in the base-metal layer 380 may be any of the plurality of metal-hole making methods known in the art.

Referring now to step 1404 of FIG. 14 and to FIG. 13, one embodiment provides a dielectric layer 370 above the base-metal layer 380. The dielectric layer 370 covers a portion of the base-metal layer 380 and the at least one hole 610 in the base-metal layer 380. In one embodiment, the dielectric layer 370 is a polyimide layer. In operation, the dielectric layer 370 is utilized to provide an electrical insulative layer between the base-metal layer 380 and the signal conductive layer 310, such as the solder pad(s) 360, the electric traces 120 and 130 of FIG. 2, and the like. Although polyimide is stated herein as the dielectric layer 370, it is appreciated that a plurality of non-conductive layers may be utilized as the dielectric layer 370 without significantly affecting the characteristics thereof.

Referring now to step 1406 of FIG. 14 and to FIG. 13, one embodiment provides a signal conductive layer above the dielectric layer. The signal conductive layer carries at least one solder pad portion 310 above a portion of the dielectric layer 370, the solder pad portion 310 placed above the dielectric layer 370 such that the solder pad portion 310 does not align with the at least one opening 1210 of the base-metal layer 380. In one embodiment, the alignment 1320 of the openings 1210 around the at least one solder pad 310 provides a significant reduction in heat absorption of the base metal layer 380.

That is, as stated herein, by removing a portion of the base-metal layer 380, that is, openings 1210, the heat waves 1330 utilized for the reflow process will be able to flow through the dielectric layer 370 and pass harmlessly through the openings 1210 in the base-metal layer 380. The importance of the removed openings 1210 in the base-metal layer 380 are even more evident when the solder pad portion 310 is reduced in size to provide the reduction in capacitance and therefore the increase in impedance. That is, when the copper pad portion 310 is reduced in size (as described in detail herein) the amount of heating 1330 passing around the copper pad portion 310 is increased. As such, the importance of providing the openings 1210 in the base-metal layer 380 to protect the dielectric layer 370 is also increased.

In one embodiment, the solder pad portion 310 of the signal-conductor layer is formed from copper. Although copper is stated herein, it is appreciated that the solder pad portion 310 may be formed from other conductors such as silver, gold, or the like, or combinations thereof. The use of copper in the description is merely for purposes of clarity. Moreover, the solder pad portion 310 of the signal conductive layer may be provided above a portion of the dielectric layer 370 via a plurality of methods which are well known in the art.

Figure 15:
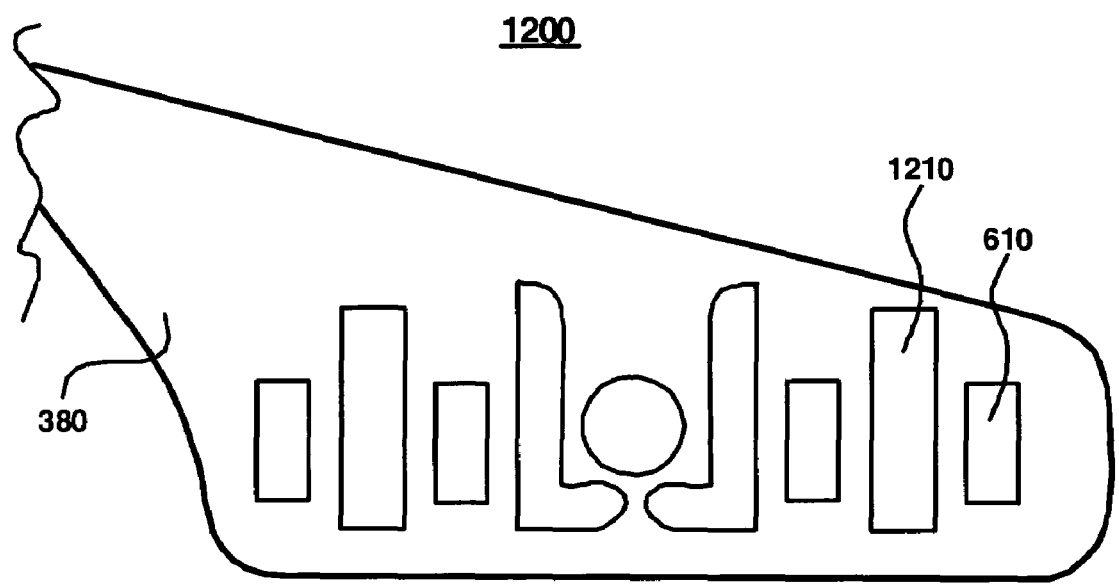
FIG. 15 is a side cut-away view of the exemplary ELS having openings in the base-metal layer under the solder pad portion and between the solder pad portion in accordance with one embodiment of the present invention.

With reference now to FIG. 15, a bottom view of another exemplary ELS is shown in accordance with another embodiment of the present invention. The exemplary ELS having openings 610 in the base-metal layer 380 under the solder pad portion 310 and also openings 2110 around the solder pad portion(s) 310. In general, the portion of the ELS shown is the base-metal portion 380 with holes 610 formed under the location wherein the termination pads connection the ELS as well as openings 1210 formed around the solder pad portion 310. In one embodiment, the ELS portion 1500 has at least one (in this example 4) solder pad(s) 310 (shown in side cut-away view 1600 of FIG. 16). The solder pads 310 are utilized as the location to perform the coupling of the ISL to the main flex-package-cable 325.

Figure 16:
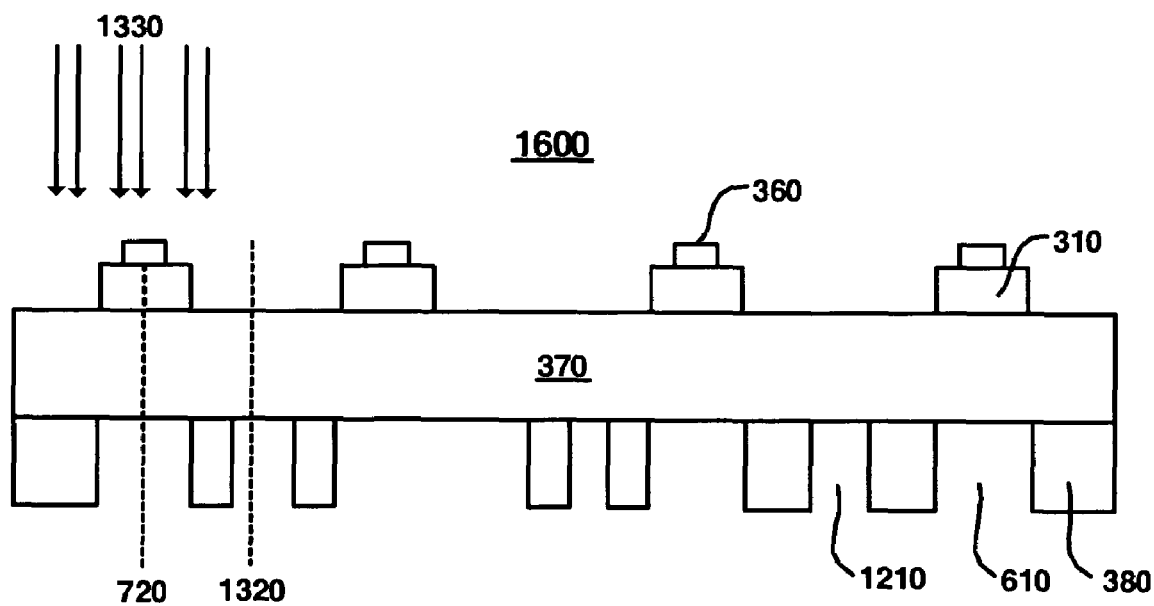
FIG. 16 is a flowchart of a method for reducing heat absorption between a solder pad portion of an ELS in accordance with one embodiment of the present invention.

Referring now to FIG. 16, a side cut-away view of the exemplary ELS 1600 having openings in the base-metal layer 380 under the solder pad portion 370 and between the solder pad portion 310 is shown in accordance with one embodiment of the present invention. Side cut-away view 1600 shows an embodiment of a three level ELS. That is, an ELS having a base-metal layer 380 with holes 610 and 1210 therein, a dielectric layer 370 and a signal conductive layer carrying solder pad portion 310. Side cut-away view 1500 also shows the solder 360 residing on solder pad 310.

Thus, not only are there holes (or openings) 1210 for allowing the heat of the reflow process to bypass the base-metal layer 380, but by introducing holes 610 in the base-metal layer 380, a significant reduction in solder pad portion 310 to base metal 380 capacitance is achieved. That is, by reducing the size of one of the conductive portions of the ELS construct (e.g., removing the base-metal below the solder pad as shown in side-view 600), the plate capacitance of the ELS construct 600 is greatly reduced. Moreover, due to the reduction of the capacitance, the impedance is greatly increased. Therefore, a reduction in signal path capacitive discontinuities is realized and the signal waveform is maintained across the solder pad connection. As stated herein, in one embodiment, the impedance gain is even more significant when the size of the solder pad portion 310 and solder 360 thereon is reduced in conjunction with the openings (e.g., openings 610 and 1210) in the base-metal layer 380.

Extended Cover Layer

Figure 17:
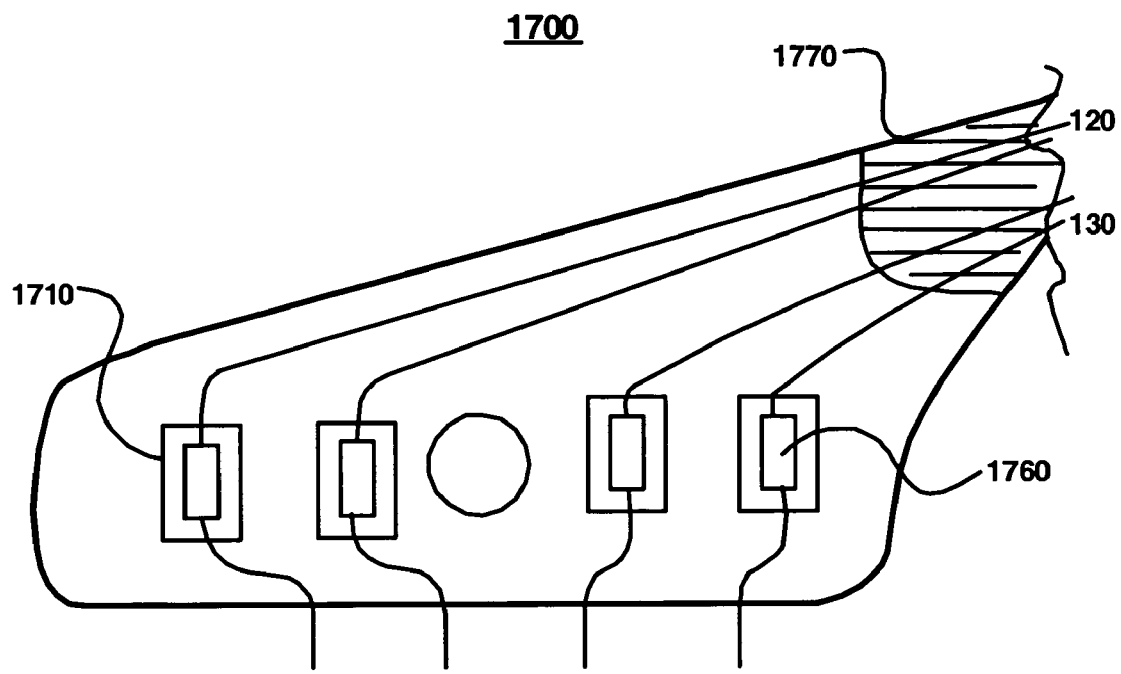
FIG. 17 is a top view of the prior art ELS having a regular cover layer.

Referring now to FIG. 17, a top view of the prior art ELS having a regular cover layer is shown. In general, the portion of the prior art ELS shown is the termination pads connection the ELS to the main flex-package-cable. In one embodiment, the ELS portion 1700 has at least 4 solder pads 1710. The solder pads 1710 are the standard size (e.g., 350 microns by 850 microns) with the standard amount of solder 1760 thereon. In addition, portion 1700 shows the standard size cover layer 1770 to the right top portion of FIG. 17.

Figure 18:
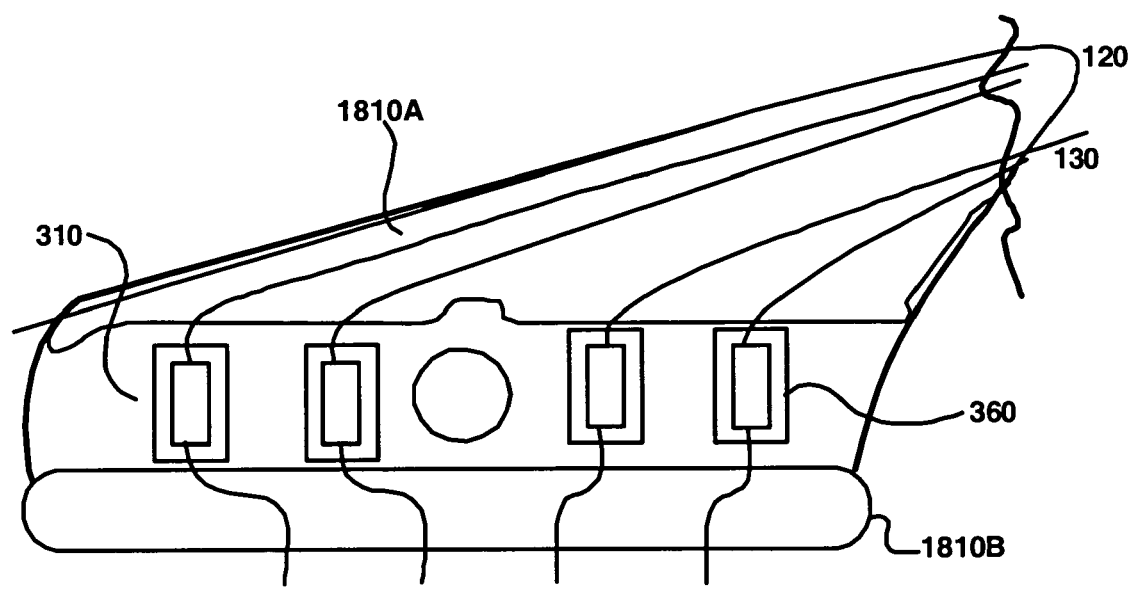
FIG. 18 is a top view of the exemplary ELS having an extended cover layer formation with respect to a solder pad portion in accordance with one embodiment of the present invention.

With reference now to FIG. 18, a top view of the exemplary ELS having an extended cover layer 1810A and 1810B formation with respect to a reduced size solder pad portion 310 is shown in accordance with one embodiment of the present invention. In general, the portion of the ELS shown is the termination pads connection the ELS to the main flex-package-cable. In one embodiment, the ELS portion 1800 has at least one (in this example 4) solder pad(s) 310. The solder pads 310 are utilized as the location to perform the coupling of the ISL to the main flex-package-cable 325. Due to the reduction of the size of the solder pad portion(s) 310, and the reduced solder 360 amount, during a solder reflow process, the solder 360 can easily overrun the now reduced size solder pad(s) 310.

In other words, unlike FIG. 17 wherein the large solder pads 1710 have sufficient size to contain all of the solder 1760 utilized thereon during the reflow process, due to the reduction in size of the solder pad portion 310 of FIG. 8, during the reflow process a portion of the solder 360 may run off of the solder pad portion 310. If the cover layer remained in the prior art location with the now reduced solder pad size, it is possible for the solder to overflow the solder pad portion and cause a bridge over the read/write channels. By extending the cover layer 1810A and adding the cover layer 1810B, embodiments reduce the opportunity for wicking of the solder to form a bridge between the read/write traces 120 and 130. Moreover, by increasing the size of the cover layer 1810A and 1810B, the problems of heat absorption during the reflow process are also reduced. That is, by utilizing a cover layer 1810A and 1810B that has a better resistance to (e.g., reflects, dissipates, or the like) the heat applied during the reflow process, the underlying dielectric layer (such as the dielectric layer 370 of FIG. 4) is protected from the additional exposure resulting from the reduced solder pad portion.

Figure 19:
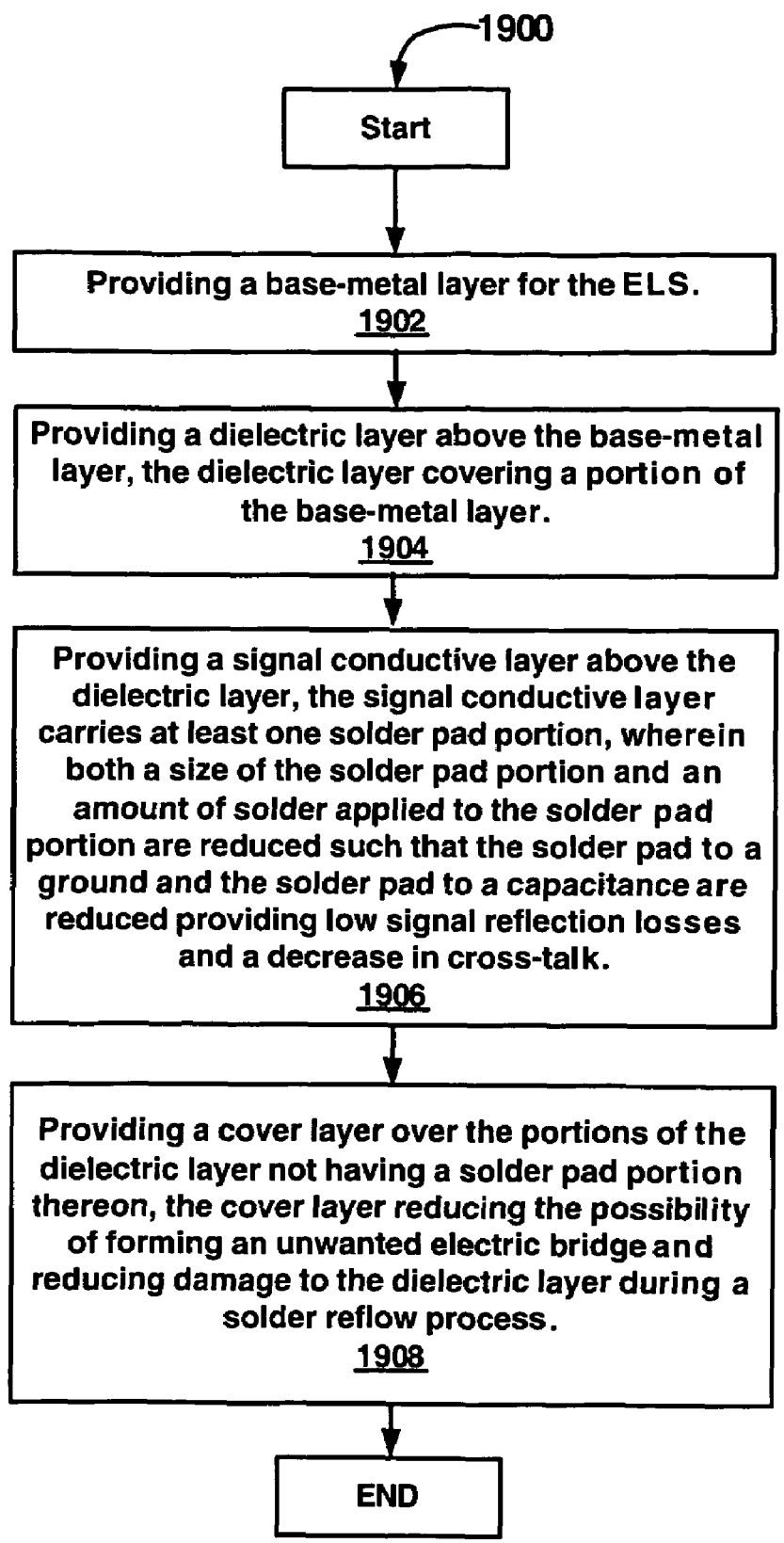
FIG. 19 is a flowchart of a method for extended cover layer formation with respect to a solder pad portion on an ELS in accordance with one embodiment of the present invention.

Referring now to FIG. 19, a flowchart of a method for extended cover layer formation with respect to a solder pad portion on an ELS is shown in accordance with one embodiment of the present invention. In general, the solder pad 310 is reduced in size and the interconnect solder 360 volume is reduced. For example, in one embodiment, the solder 360 volume is reduced between 2 and 6 times, while the size of the solder pad portion 310 is reduced to approximately 200 microns by 475 microns. Although, specific measurements are given, it is appreciated that the reduced solder pad portion 310 may be significantly altered including the use of a plurality of geometric shapes while still remaining within the scope of the invention.

By reducing the size of the solder pad portion(s) 310 and the amount of solder 360 utilized thereon, a large reduction in solder pad portion 310 to base metal 380 capacitance (shown in FIG. 4) is achieved. That is, by reducing the size of one of the conductive portions of the ELS construct (e.g., as shown in side-view 400 of FIG. 4), the plate capacitance of the ELS construct 400 is greatly reduced. Moreover, due to the reduction of the capacitance, the impedance is greatly increased. Therefore, a reduction in signal path capacitive discontinuities is realized and the signal waveform is maintained across the solder pad connection.

Referring now to step 1902 of FIG. 19 and to FIG. 4, one embodiment provides a base-metal layer 380 for the ELS 400. That is, the portion of the ELS shown in diagram 400 initially incorporates a bottom or base-metal layer 380 as the foundation upon which to build the structure 400. In one embodiment, the base-metal layer 380 is stainless steel. In operation, the stainless steel base-metal layer 380 is utilized to provide the necessary support and an electrical ground to the overall structure of the ELS as shown in FIG. 2. Although stainless steel is stated herein as the base-metal layer, it is appreciated that a plurality of metals may be utilized as the base-metal layer 380.

Referring now to step 1904 of FIG. 19 and to FIG. 4, one embodiment provides a dielectric layer 370 above the base-metal layer 380. In one embodiment, the dielectric layer 370 is a polyimide layer. In operation, the dielectric layer 370 is utilized to provide an electrical insulative layer between the base-metal layer 380 and the signal conductive layer 310, such as solder pad(s) 360, electric traces 120 and 130 of FIG. 2, and the like. Although polyimide is stated herein as the dielectric layer 370, it is appreciated that a plurality of non-conductive layers may be utilized as the dielectric layer 370 without significantly affecting the characteristics thereof.

Referring now to step 1906 of FIG. 5 and to FIG. 18, one embodiment provides a signal conductive layer above the dielectric layer. The signal conductive layer carries at least one solder pad portion 310 above a portion of the dielectric layer 370, wherein both the size of the solder pad portion 310 and the amount of solder 360 applied to the solder pad portion 370 are reduced. In so doing, the solder pad 370 to a ground and the solder pad 370 to a capacitance are reduced thereby providing low signal reflection losses and a decrease in crosstalk. In other words, as stated herein, by reducing the size of the solder pad portion(s) 310 and the amount of solder 360 used on the solder pad portion(s) 310, a significant reduction in solder pad portion 310 to base metal 380 (of FIG. 4) capacitance is achieved.

Therefore, by reducing the size of one of the conductive portions of the ELS construct (e.g., as shown in side-view 400), the plate capacitance of the ELS construct 400 (e.g., base-metal 380 to solder pad portion 310) is greatly reduced. Moreover, due to the reduction of the capacitance, the impedance is greatly increased. Thus, a reduction in signal path capacitive discontinuities is realized and the signal waveform is maintained across the solder pad connection.

In one embodiment, the solder pad portion 310 of the signal-conductor layer is formed from copper. Although copper is stated herein, it is appreciated that the solder pad portion 310 may be formed from other conductors such as silver, gold, or the like or combinations thereof. The use of copper in the description is merely for purposes of clarity. Moreover, the solder pad portion 310 of the signal conductive layer may be provided above a portion of the dielectric layer 370 via a plurality of methods which are well known in the art.

Referring now to Step 1908 of FIG. 19 and to FIG. 18, one embodiment provides a cover layer 1810A/B over the portions of the dielectric layer 370 not having a solder pad portion 310 thereon. The cover layer 1810A/B reducing the possibility of forming an unwanted electric bridge during a solder reflow process. That is, as described herein, by extending the cover layer 1810A and adding the cover layer 1810B, embodiments reduce the opportunity for wicking of the solder to form a bridge between the read/write traces 120 and 130. Moreover, by increasing the size of the cover layer 1810A and 1810B, the problems of heat absorption during the reflow process are also reduced. That is, by utilizing a cover layer 1810A and 1810B that has a better resistance to (e.g., reflects, dissipates, or the like) the heat applied during the reflow process, the underlying dielectric layer (such as the dielectric layer 370 of FIG. 4) is protected from the additional exposure resulting from the reduced solder pad portion.

Thus, embodiments of the present invention provide, a method and system for reducing heat absorption around solder pads on an ELS. Additionally, embodiments provide a method and system for reducing heat absorption around solder pads on an ELS which can reduce the destructive effect of the heat process on the dielectric layer during reflow of the solder.

While the method of the embodiment illustrated in flow charts 500, 800, 1100, 1400 and 1900 show specific sequences and quantity of steps, the present invention is suitable to alternative embodiments. For example, not all the steps provided for in the methods are required for the present invention. Furthermore, additional steps can be added to the steps presented in the present embodiment. Likewise, the sequences of steps can be modified depending upon the application.

The alternative embodiment(s) of the present invention, a method and system for reducing heat absorption around solder pads on an ELS is thus described. While the present invention has been described in particular embodiments, it should be appreciated that the present invention should not be construed as limited by such embodiments, but rather construed according to the below claims.

What is claimed is:

1. A method for reducing heat absorption around solder pads on an electrical lead suspension (ELS) comprising:
   providing a base-metal layer having at least one opening;
   providing a dielectric layer above the base-metal layer, said dielectric layer covering a portion of said base-metal layer and the at least one opening in said base-metal layer;
   providing a signal conductive layer above the dielectric layer, said signal conductive layer comprising:
      at least one solder pad portion, and
   placing said solder pad portion comprised only from said signal conductive layer above said portion of said dielectric layer such that said solder pad portion is adjacent to, but does not align with the at least one opening in said base-metal layer, wherein during reflow of a solder on said solder pad the heat absorption with respect to said base-metal layer is reduced.

2. The method of claim 1 wherein said solder pad portion comprises leaded, unleaded or any other form of solder material.

3. The method of claim 1 wherein said base-metal layer of said ELS is comprised of stainless steel.

4. The method of claim 1 wherein said solder pad portion is reduced to approximately 200 microns by approximately 475 microns.

5. The method of claim 1 wherein a plurality of openings are provided in said base-metal layer around the location of said at least one solder pad portion.

6. The method of claim 1 wherein a plurality of openings are provided in said base-metal layer around the location of a plurality of said solder pad portions.

7. The method of claim 1 wherein the at least one opening in said base-metal layer is formed by a shaping device from the group of shaping devices consisting of: cutting, milling, grinding, molding, injecting, stamping, or etching.

8. The method of claim 1 further comprising:
   providing a second opening in said base-metal layer;
   providing a dielectric layer above the base-metal layer, said dielectric layer covering a portion of said base-metal layer and said second opening of said base-metal layer; and
   aligning said solder pad portion aligned above said portion of said dielectric layer covering said second opening of said base-metal layer, wherein the aligning of the solder pad portion over the second opening of said base-metal layer reduces the signal-conductor to base-metal layer capacitance and increases impedance between said solder pad portion and said base-metal layer.

9. An electrical lead suspension (ELS) having openings in the base-metal substrate between solder pads comprising:
   a base-metal layer having at least one opening;
   a dielectric layer above the base-metal layer, said dielectric layer covering a portion of said base-metal layer and the at least one opening in said base-metal layer;
   a signal conductive layer above the dielectric layer, said signal conductive layer comprising:
      at least one solder pad portion, and
   placing said solder pad portion comprised only from said signal conductive layer above said portion of said dielectric layer such that said solder pad portion is adjacent to, but does not align with the at least one opening in said base-metal layer, wherein during reflow of a solder on said solder pad the heat absorption with respect to said base-metal layer is reduced.

10. The ELS of claim 9 wherein said solder pad portion comprises leaded, unleaded or any other form of solder material.

11. The ELS of claim 9 wherein said base-metal layer of said ELS is comprised of stainless steel.

12. The ELS of claim 9 wherein said solder pad portion is reduced to approximately 200 microns by approximately 475 microns.

13. The ELS of claim 9 wherein a plurality of openings are provided in said base-metal layer around the location of said at least one solder pad portion.

14. The ELS of claim 9 wherein a plurality of openings are provided in said base-metal layer around the location of a plurality of said solder pad portions.

15. The ELS of claim 9 wherein the at least one opening in said base-metal layer is formed by a shaping device from the group of shaping devices consisting of: cutting, milling, grinding, molding, injecting, stamping, or etching.

16. The ELS of claim 9 further comprising:
   a second opening in said base-metal layer;
   a dielectric layer above the base-metal layer, said dielectric layer covering a portion of said base-metal layer and said second opening of said base-metal layer; and
   said solder pad portion aligned above said portion of said dielectric layer covering said second opening of said base-metal layer, wherein the alignment of the solder pad portion over the second opening of said base-metal layer reduces the signal-conductor to base-metal layer capacitance and increases impedance between said solder pad portion and said base-metal layer.

17. A hard disk drive comprising:
   a housing;
   a disk pack mounted to the housing and having a plurality of disks that are rotatable relative to the housing, the disk pack defining an axis of rotation and a radial direction relative to the axis, and the disk pack having a downstream side wherein air flows away from the disks, and an upstream side wherein air flows toward the disk;
   an actuator mounted to the housing and being movable relative to the disk pack, the actuator having a plurality of heads for reading data from and writing data to the disks; and
   an integrated lead suspension, said electrical lead suspension (ELS) having openings in a base-metal substrate between solder pads comprising:
      a base-metal layer having at least one opening;
      a dielectric layer above the base-metal layer, said dielectric layer covering a portion of said base-metal layer and the at least one opening in said base-metal layer;

a signal conductive layer above the dielectric layer, said signal conductive layer comprising:
  at least one solder pad portion, and
  placing said solder pad portion comprised only from said signal conductive layer above said portion of said dielectric layer such that said solder pad portion is adjacent to, but does not align with the at least one opening in said base-metal layer, wherein during reflow of a solder on said solder pad the heat absorption with respect to said base-metal layer is reduced.

18. The hard disk drive of claim 17 wherein said solder pad portion comprises leaded, unleaded or any other form of solder material.

19. The hard disk drive of claim 17 wherein said base-metal layer of said ELS is comprised of stainless steel.

20. The hard disk drive of claim 17 wherein said solder pad portion is reduced to approximately 200 microns by approximately 475 microns.

21. The hard disk drive of claim 17 wherein a plurality of openings are provided in said base-metal layer around the location of said at least one solder pad portion.

22. The hard disk drive of claim 17 wherein a plurality of openings are provided in said base-metal layer around the location of a plurality of said solder pad portions.

23. The hard disk drive of claim 17 wherein the at least one opening in said base-metal layer is formed by a shaping device from the group of shaping devices consisting of: cutting, milling, grinding, molding, injecting, stamping, or etching.

24. The hard disk drive of claim 17 further comprising:
  a second opening in said base-metal layer;
  a dielectric layer above the base-metal layer, said dielectric layer covering a portion of said base-metal layer and said second opening of said base-metal layer; and
  said solder pad portion aligned above said portion of said dielectric layer covering said second opening of said base-metal layer, wherein the alignment of the solder pad portion over the second opening of said base-metal layer reduces the signal-conductor to base-metal layer capacitance and increases impedance between said solder pad portion and said base-metal layer.

25. An electrical lead suspension (ELS) having openings in a base-metal substrate between solder pads comprising:
  a means for providing a base-metal layer having at least one opening;
  a means for providing a dielectric layer above the base-metal layer, said dielectric layer covering a portion of said base-metal layer and at least one of the openings in said base-metal layer;
  a means for providing a signal conductive layer above the dielectric layer, said signal conductive layer comprising:
    at least one solder pad portion, and
  placing said solder pad portion comprised only from said signal conductive layer above said portion of said dielectric layer such that said solder pad portion is adjacent to, but does not align with the at least one opening in said base-metal layer, wherein during reflow of a solder on said solder pad the heat absorption with respect to said base-metal layer is reduced.

26. The ELS of claim 25 further comprising:
  a means for providing a second opening in said base-metal layer;
  a means for providing a dielectric layer above the base-metal layer, said dielectric layer covering a portion of said base-metal layer and said second opening of said base-metal layer; and
  a means for aligning said solder pad portion above said portion of said dielectric layer covering said second opening of said base-metal layer, wherein the aligning of the solder pad portion over the second opening of said base-metal layer reduces the signal-conductor to base-metal layer capacitance and increases impedance between said solder pad portion and said base-metal layer.

\* \* \* \* \*